(12) United States Patent
Ueno et al.

(10) Patent No.: US 8,893,072 B2
(45) Date of Patent: Nov. 18, 2014

(54) EQUIVALENT CIRCUIT OF SEMICONDUCTOR DEVICE, SIMULATION METHOD FOR SEMICONDUCTOR DEVICE, AND SIMULATION DEVICE FOR SEMICONDUCTOR DEVICE

(71) Applicant: Panasonic Corporation, Osaka (JP)

(72) Inventors: Hiroaki Ueno, Osaka (JP); Daisuke Ueda, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/870,565

(22) Filed: Apr. 25, 2013

(65) Prior Publication Data

US 2013/0234791 A1  Sep. 12, 2013

Related U.S. Application Data

(63) Continuation of application No. PCT/JP2012/005682, filed on Sep. 7, 2012.

(30) Foreign Application Priority Data

Sep. 13, 2011  (JP) .................................. 2011-199298

(51) Int. Cl.
| | |
|---|---|
| *G06F 17/50* | (2006.01) |
| *H01L 29/778* | (2006.01) |
| *H03K 17/56* | (2006.01) |
| *H01L 29/10* | (2006.01) |
| *H01L 29/20* | (2006.01) |

(52) U.S. Cl.
CPC ............ *H03K 17/56* (2013.01); *H01L 29/7786* (2013.01); *H01L 29/1066* (2013.01); *H01L 29/2003* (2013.01)
USPC ........................................................ 716/136

(58) Field of Classification Search
USPC ................................................... 716/100, 136
See application file for complete search history.

(56) References Cited

U.S. PATENT DOCUMENTS

| | | | | |
|---|---|---|---|---|
| 2002/0196212 | A1* | 12/2002 | Nishitoba et al. | ............... 345/76 |
| 2011/0062495 | A1* | 3/2011 | Koudymov | ................... 257/192 |
| 2012/0004896 | A1* | 1/2012 | Li et al. | ............................ 703/14 |

FOREIGN PATENT DOCUMENTS

| | | |
|---|---|---|
| JP | 11-354815 | 12/1999 |
| JP | 2002-280571 | 9/2002 |

OTHER PUBLICATIONS

International Search Report (in English language) issued in International Application No. PCT/JP2012/005682 on Dec. 4, 2012.
Akira Nakajima et al., "Equivalent Circuit Model for GaN-HEMTs in a Switching Simulation", IEEE 30th International Telecommunications Energy Conference (INTELEC 2008), Sep. 14-18, 2008, http://ieeexplore.ieee.org/xpls/abs_all.jsp?arnumber=4664095.
Lawrence Dunleavy et al., "Modeling GaN : Powerful but Challenging", IEEE Microwave Magazine, Oct. 2010, vol. 11, No. 6, p. 82-96.

* cited by examiner

*Primary Examiner* — Suchin Parihar
(74) *Attorney, Agent, or Firm* — Wenderoth, Lind & Ponack, L.L.P.

(57) ABSTRACT

An equivalent circuit includes: a first transistor having a first gate electrode, a first source electrode, and a first drain electrode; a second transistor having a second gate electrode, a second drain electrode, and a second source electrode electrically connected to the first drain electrode; and a charging and discharging circuit which includes a first capacitor having a terminal electrically connected to the second gate electrode and another terminal electrically connected to the second source electrode, and charges and discharges the first capacitor with predetermined time constants.

11 Claims, 11 Drawing Sheets

FIG. 5

| | First switch | Second switch | Third switch | Fourth switch | Fifth switch |
|---|---|---|---|---|---|
| Switching OFF state (S102) | OFF | ON | ON | OFF | OFF |
| Switching ON state (S103) | ON | OFF | OFF | ON | ON |

FIG. 8

```
L_L1     0 N01704 5nH
L_L2     N01715 N01257 5nH
C_C1     N07148 N01708 1n TC=0,0
R_R1     N01257 N01261 100 TC=0,0
V_V1     N01261 0 300Vdc
X_U1     N01760 N01708 N01704 GAN-GIT
R_R2     N21038 N01708 200 TC=0,0
V_V2     N01760 0
+ PULSE 0 3 0.1u 10n 10n 1u 2.12u
X_U2     N07148 N01715 N01708 GAN-GIT-C
X_SI     N01760 0 N15795 N07148 SCHEMATIC1_S1
R_R3     N15795 N15791 50 TC=0,0
C_C2     N15791 N21824 200n IC=-3 TC=0.0
X_S3     N01760 0 N07148 N21038 SCHEMATIC1_S3
X_S2     N01760 0 N01708 N21824 SCHEMATIC1_S2
X_S4     N01760 0 N15791 0 SCHEMATIC1_S4
X_S5     N01760 0 N21824 N01760 SCHEMATIC1_S5

.subckt SCHEMATIC1_S1 1 2 3 4
S_S1     3 4 1 2_S1
RS_S1    1 2 1G
.MODEL    _S1 VSWITCH Roff=1e6 Ron=1.0 Voff=1.47V Von=0V
.ends SCHEWIATIC1_S1

.subckt SCHEMATIC1_S3 1 2 3 4
S_S3     3 4 1 2_S3
RS_S3    1 2 1G
.MODEL    _S3 VSWITCH Roff=1e6 Ron=1.0 Voff=0V Von=1.47V
.ends SCHEMATIC1_S3

.subckt SCHEMATIC1_S2 1 2 3 4
S_S2     3 4 1 2_S2
RS_S2    1 2 1G
.MODEL    _S2 VSWITCH Roff=1e6 Ron=1.0 Voff=1.47V Von=0V
.ends SCHEMATIC1_S2

.subckt SCHEMATIC1_S4 1 2 3 4
S_S4     3 4 1 2_S4
RS_S4    1 2 1G
.MODEL    _S4 VSWITCH Roff=1e6 Ron=1.0 Voff =0V Von=1.47V
.ends SCHEMAT1C1_S4

.subckt SCHEMAT1C1_S5 1 2 3 4
S_S5     3 4 1 2_S5
RS_S5    1 2 1G
.MODEL    _S5 VSWITCH Roff=1e6 Ron=1.0 Voff=0V Von =1.47V
.ends SCHEMATIC1_S5
```

EQUIVALENT CIRCUIT OF SEMICONDUCTOR DEVICE, SIMULATION METHOD FOR SEMICONDUCTOR DEVICE, AND SIMULATION DEVICE FOR SEMICONDUCTOR DEVICE

CROSS REFERENCE TO RELATED APPLICATIONS

This is a continuation application of PCT International Application No. PCT/JP2012/005682 filed on Sep. 7, 2012, designating the United States of America, which is based on and claims priority of Japanese Patent Application No. 2011-199298 filed on Sep. 13, 2011. The entire disclosures of the above-identified applications, including the specifications, drawings and claims are incorporated herein by reference in their entirety.

FIELD

One or more exemplary embodiments disclosed herein relate generally to a simulation method for simulating electrical properties of a semiconductor device, and in particular to a simulation method for simulating a current collapse phenomenon of a transistor, using an equivalent circuit.

BACKGROUND

In recent years, there has been an increasing demand for improvement in power conversion efficiency in the power electronics industry, in order to reduce the amount of greenhouse gas emission to prevent global warming.

Switching devices such as power metal-oxide-semiconductor field effect transistors (MOSFETs) and insulated gate bipolar transistors (IGBTs) which include silicon as material have been used for power electronic circuits.

Research has been conducted on achieving switching devices to be practically utilized which include group III nitride semiconductors that cause less loss, instead of switching devices which include silicon.

However, a phenomenon called current collapse easily occurs in a switching device which includes a group III nitride semiconductor as material.

A current collapse phenomenon is a temporal change in the current at the time of switching. For example, a portion in which crystal on the surface or inside of a semiconductor layer has defect and a portion damaged due to a processing process serve as traps for collecting electric charge. Electric charge is collected by such traps or electric charge is released from the traps, thereby causing a temporal change in a current at the time of switching. The temporal change in a current is a current collapse phenomenon.

CITATION LIST

Patent Literature

[PTL 1] Japanese Unexamined Patent Application Publication No. 11-354815

SUMMARY

Technical Problem

PTL 1 discloses a simulation method for simulating current characteristics of a semiconductor device. However, it is difficult to reproduce the influence of a current collapse phenomenon with high precision by using such a simulation method.

In view of this, one non-limiting and exemplary embodiment provides, for instance, an equivalent circuit of a semiconductor device which can reproduce a current collapse phenomenon with high precision.

Solution to Problem

In one general aspect, the techniques disclosed here feature an equivalent circuit of a semiconductor device having a gate, a source, and a drain, the equivalent circuit including: a first transistor having a first source electrode, a first drain electrode, and a first gate electrode electrically connected to a first electrode corresponding to the gate of the semiconductor device; a second transistor having a second gate electrode, a second drain electrode, and a second source electrode electrically connected to the first drain electrode; a first capacitor having a terminal electrically connected to the second gate electrode, and another terminal electrically connected to the second source electrode; a first resistor and a first switch electrically connected in series, and having a terminal electrically connected to the second gate electrode and another terminal electrically connected to the second source electrode; a second resistor and a second capacitor electrically connected in series; a second switch having a terminal electrically connected to the second gate electrode, and another terminal electrically connected to a terminal of the second resistor and the second capacitor electrically connected in series; a third switch having a terminal electrically connected to the second source electrode, and another terminal electrically connected to another terminal of the second resistor and the second capacitor electrically connected in series; a first inductor having a terminal electrically connected to the first source electrode, and another terminal electrically connected to a second electrode corresponding to the source of the semiconductor device; and a second inductor having a terminal electrically connected to the second drain electrode, and another terminal electrically connected to a third electrode corresponding to the drain of the semiconductor device.

These general and specific aspects may be implemented using a system, a method, an integrated circuit, a computer program, or a computer-readable recording medium such as a CD-ROM, or any combination of systems, methods, integrated circuits, computer programs, or computer-readable recording media.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects

According to, for instance, an equivalent circuit of a semiconductor device according to one or more exemplary embodiments or features disclosed herein, the influence of a current collapse phenomenon on current characteristics in a semiconductor device can be reproduced with high precision.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 5 illustrates states of switches during a simulation.

FIG. 8 illustrates an example of a netlist of the equivalent circuit.

DESCRIPTION OF EMBODIMENTS (Underlying Knowledge Forming Basis of the Present Disclosure)

As described in the Background section, it is difficult to reproduce, with high precision, the influence of a current collapse phenomenon on current characteristics of a semiconductor device.

The influence of a current collapse phenomenon depends on various characteristics such as the density and the energy level of the above-mentioned traps, a frequency and a value of a driving voltage in switching operation, and an operating temperature of a semiconductor device.

In order to optimally design a power electronic circuit, it is indispensable to reproduce the influence of a current collapse phenomenon on a current by simulation.

Figure 1:
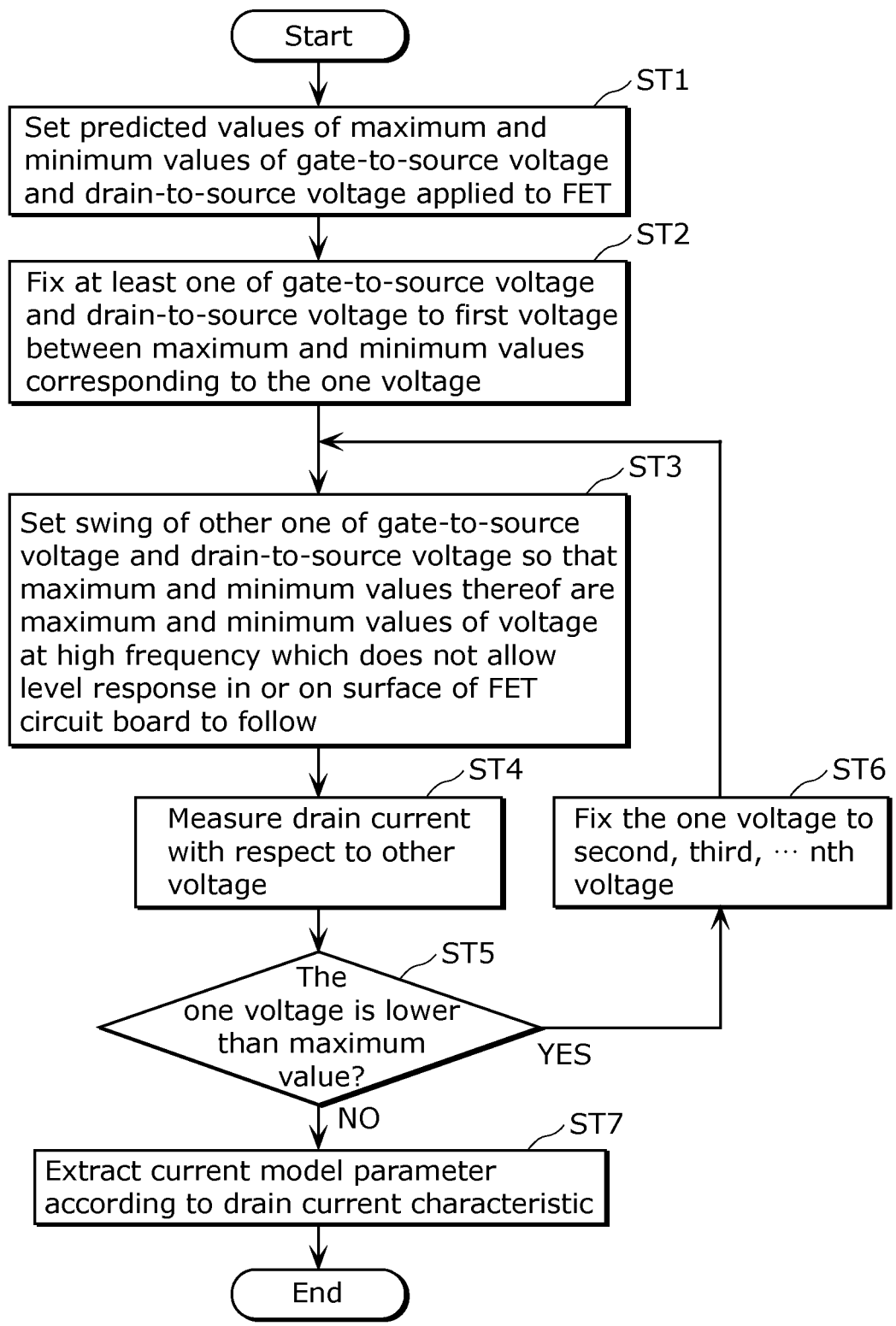
FIG. 1 is a flowchart of a simulation method disclosed in PTL 1.

FIG. 1 is a flowchart of a simulation method disclosed in PTL 1.

With the simulation method disclosed in FIG. 1, a model parameter for reproducing current characteristics exhibited by a semiconductor device when a current collapse phenomenon occurs is obtained for each of predetermined conditions (such as frequency, driving voltage, operating temperature).

Here, the influence of a current collapse phenomenon on current characteristics of a semiconductor device dynamically changes along with the change of the above predetermined conditions even when the same operation runs on the same circuit.

Specifically, it is difficult to flexibly reproduce the influence of a current collapse phenomenon which changes dynamically, by using a method of obtaining parameters in consideration of the influence of a current collapse phenomenon under predetermined conditions one by one, as with the method disclosed in PTL 1. Thus, it is difficult to reproduce the influence of a current collapse phenomenon with high precision.

In view of this, an equivalent circuit of a semiconductor device according to an aspect of the present disclosure is an equivalent circuit of a semiconductor device having a gate, a source, and a drain, the equivalent circuit including: a first transistor having a first source electrode, a first drain electrode, and a first gate electrode electrically connected to a first electrode corresponding to the gate of the semiconductor device; a second transistor having a second gate electrode, a second drain electrode, and a second source electrode electrically connected to the first drain electrode; a first capacitor having a terminal electrically connected to the second gate electrode, and another terminal electrically connected to the second source electrode; a first resistor and a first switch electrically connected in series, and having a terminal electrically connected to the second gate electrode and another terminal electrically connected to the second source electrode; a second resistor and a second capacitor electrically connected in series; a second switch having a terminal electrically connected to the second gate electrode, and another terminal electrically connected to a terminal of the second resistor and the second capacitor electrically connected in series; a third switch having a terminal electrically connected to the second source electrode, and another terminal electrically connected to another terminal of the second resistor and the second capacitor electrically connected in series; a first inductor having a terminal electrically connected to the first source electrode, and another terminal electrically connected to a second electrode corresponding to the source of the semiconductor device; and a second inductor having a terminal electrically connected to the second drain electrode, and another terminal electrically connected to a third electrode corresponding to the drain of the semiconductor device.

Accordingly, a current collapse phenomenon of the semiconductor device can be reproduced with high precision.

In addition, according to an aspect of the present disclosure, a resistance value of the first resistor and a resistance value of the second resistor may each have a predetermined temperature characteristic.

Accordingly, a current collapse phenomenon of the semiconductor device can be reproduced with high precision, including a temperature change occurring in its surroundings.

In addition, according to an aspect of the present disclosure, the equivalent circuit may further include: a pulse power supply having a positive terminal electrically connected to the first electrode, and a negative terminal electrically connected to the second electrode; a fourth switch having a terminal electrically connected to the first electrode, and another terminal electrically connected to a terminal of the second capacitor; and a fifth switch having a terminal electrically connected to the second electrode, and another terminal electrically connected to another terminal of the second capacitor.

In addition, according to an aspect of the present disclosure, the first transistor may be a normally-off transistor, and the second transistor may be a normally-on transistor.

A simulation method for a semiconductor device according to an aspect of the present disclosure is a simulation method for a semiconductor device performed using the equivalent circuit according to one of the above aspects, the simulation method including: in a state where the second switch and the third switch are off and the second capacitor is charged to a first voltage, applying, across the first electrode and the second electrode, a voltage for bringing the first transistor from an ON state into an OFF state, and simultaneously, charging the first capacitor and bringing the second transistor from the OFF state into the ON state by turning off the first switch and turning on the second switch and the third switch; in a state where the first switch is off and the first capacitor is charged to a second voltage, applying, across the first electrode and the second electrode, a voltage for bringing the first transistor from the OFF state into the ON state, and simultaneously, discharging the first capacitor and bringing the second transistor from the ON state into the OFF state by turning on the first switch and turning off the second switch and the third switch; and obtaining a temporal change in a current flowing from the third electrode to the second electrode in each of the states.

In addition, a simulation device for a semiconductor device according to an aspect of the present disclosure may include a storage unit configured to store therein the equivalent circuit according to one of the above aspects as circuit information, and a program for executing the simulation method according to the above aspect; an input unit configured to accept input of values of voltages to be applied to the first electrode, the second electrode, and the third electrode, and a value of a voltage to which the first capacitor is to be charged or a value of a voltage to which the second capacitor is to be charged; and an arithmetic unit configured to calculate an electrical property of the semiconductor device, using the circuit information, the program, and the input.

In addition, an aspect of the present disclosure may be achieved as a recording medium having stored therein an equivalent circuit of a semiconductor device as circuit information.

It should be noted that an equivalent circuit of a semiconductor device according to an aspect of the present disclosure may be an equivalent circuit of a semiconductor device having a gate, a source, and a drain, the equivalent circuit including: a first transistor having a first gate electrode corresponding to the gate of the semiconductor device, a first source electrode corresponding to the source of the semiconductor device, and a first drain electrode; a second transistor having a second gate electrode, a second source electrode electrically connected to the first drain electrode, and a second drain electrode corresponding to the drain of the semiconductor device; and a charging and discharging circuit which includes a first capacitor having a terminal electrically connected to the second gate electrode and another terminal electrically connected to the second source electrode, and charges and discharges the first capacitor with predetermined time constants.

It should be noted that in the equivalent circuit according to an aspect of the present disclosure, the charging and discharging circuit may include: a first circuit which determines the time constant with which the first capacitor is charged; and a second circuit which determines the time constant with which the first capacitor is discharged.

These general and specific aspects may be implemented using a system, a method, an integrated circuit, a computer program, or a computer-readable recording medium such as a CD-ROM, or any combination of systems, methods, integrated circuits, computer programs, or computer-readable recording media.

Hereinafter, certain exemplary embodiments are described in greater detail with reference to the accompanying Drawings.

Embodiment 1

The following is a description of Embodiment 1 with reference to the accompanying drawings. In Embodiment 1, a description is given of a simulation method for simulating electrical properties of a semiconductor device, using an equivalent circuit.

It should be noted that each of the exemplary embodiments described below shows a general or specific example. The numerical values, shapes, materials, constituent elements, the arrangement and connection of the constituent elements, steps, the processing order of the steps and the like shown in the following exemplary embodiments are mere examples, and therefore do not limit the scope of the appended Claims and their equivalents. Therefore, among the constituent elements in the following exemplary embodiments, constituent elements not recited in any of the independent claims defining the most generic part of the inventive concept are described as arbitrary constituent elements.

<Configuration of Semiconductor Device>

First is a description of a semiconductor device for which a simulation is performed.

A semiconductor device according to the present embodiment is a transistor which includes a group III nitride semiconductor as material.

Figure 2:
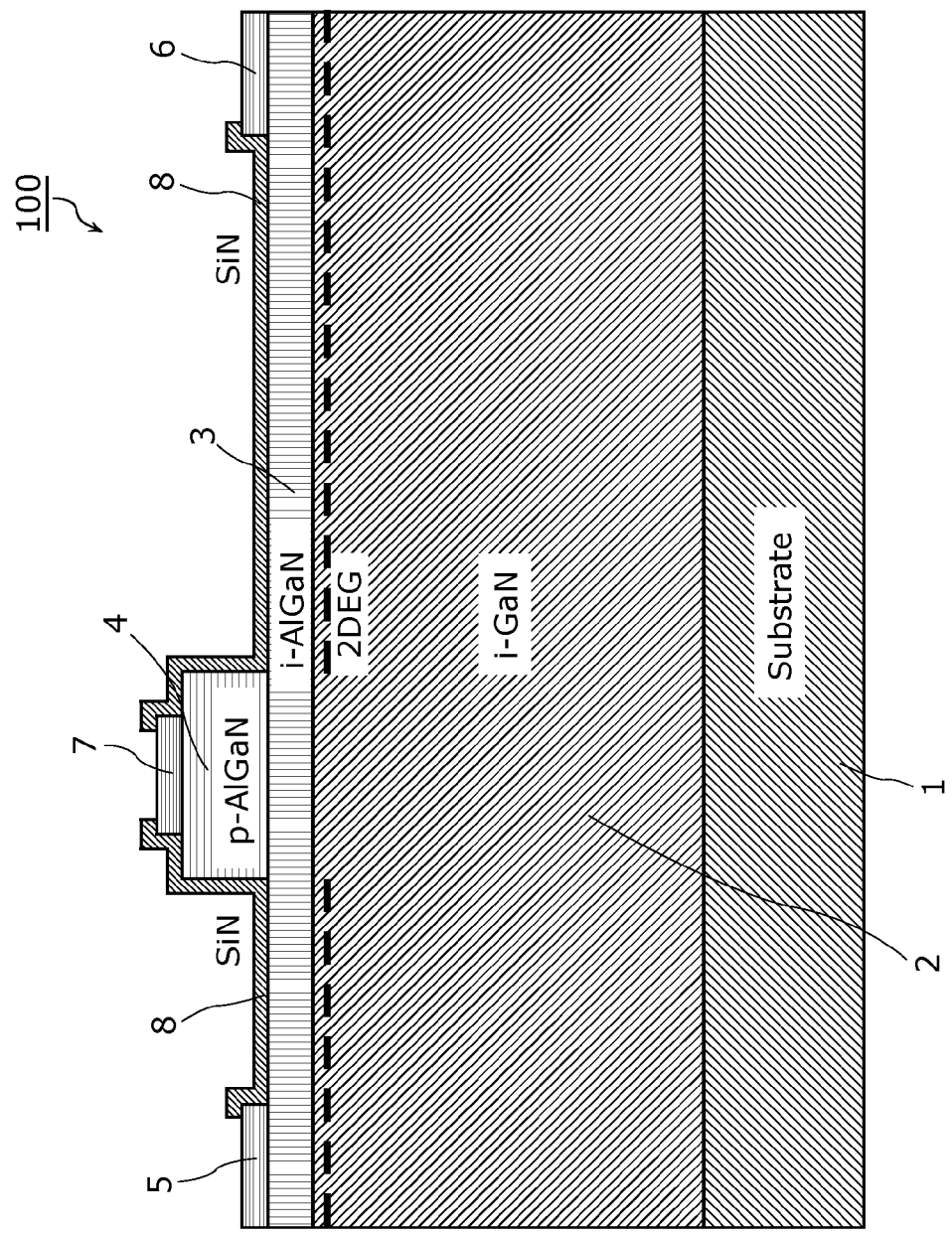
FIG. 2 is a cross-sectional view of a semiconductor device according to Embodiment 1.

FIG. 2 is a cross-sectional view of a semiconductor device according to Embodiment 1.

A semiconductor device 100 includes a substrate 1, a first semiconductor layer 2, a second semiconductor layer 3, a control layer 4, a source electrode 5, a drain electrode 6, a gate electrode 7, and a protective film 8.

The substrate 1 is a semiconductor substrate, and the material of the substrate 1 is silicon (Si), for example.

The first semiconductor layer 2 is formed above the substrate 1. The material of the first semiconductor layer 2 is a group III nitride semiconductor. The material of the first semiconductor layer 2 is i-GaN, for example.

The second semiconductor layer 3 is formed above the first semiconductor layer 2. The material of the second semiconductor layer 3 is a group III nitride semiconductor. The material of the second semiconductor layer 3 has a greater band gap than the material of the first semiconductor layer 2. The material of the second semiconductor layer 3 is i-AlGaN, for example.

The control layer 4, the source electrode 5, and the drain electrode 6 are formed above the second semiconductor layer 3 so as to be separate from one another.

The material of the source electrode 5 and the drain electrode 6 is an alloy of gold and titanium, for example. The material of the control layer 4 is a group III nitride semiconductor having p-type conductivity. The material of the control layer 4 is p-AlGaN, for example.

The gate electrode 7 is formed above the control layer 4. The material of the gate electrode 7 is an alloy of gold and titanium, for example.

The protective film 8 is formed so as to cover the surfaces of the second semiconductor layer 3 and the control layer 4. At least part of the surface of each of the source electrode 5, the drain electrode 6, and the gate electrode 7 is not covered with the protective film 8.

<Configuration of Equivalent Circuit>

Next is a description of an equivalent circuit of the semiconductor device 100.

Figure 3:
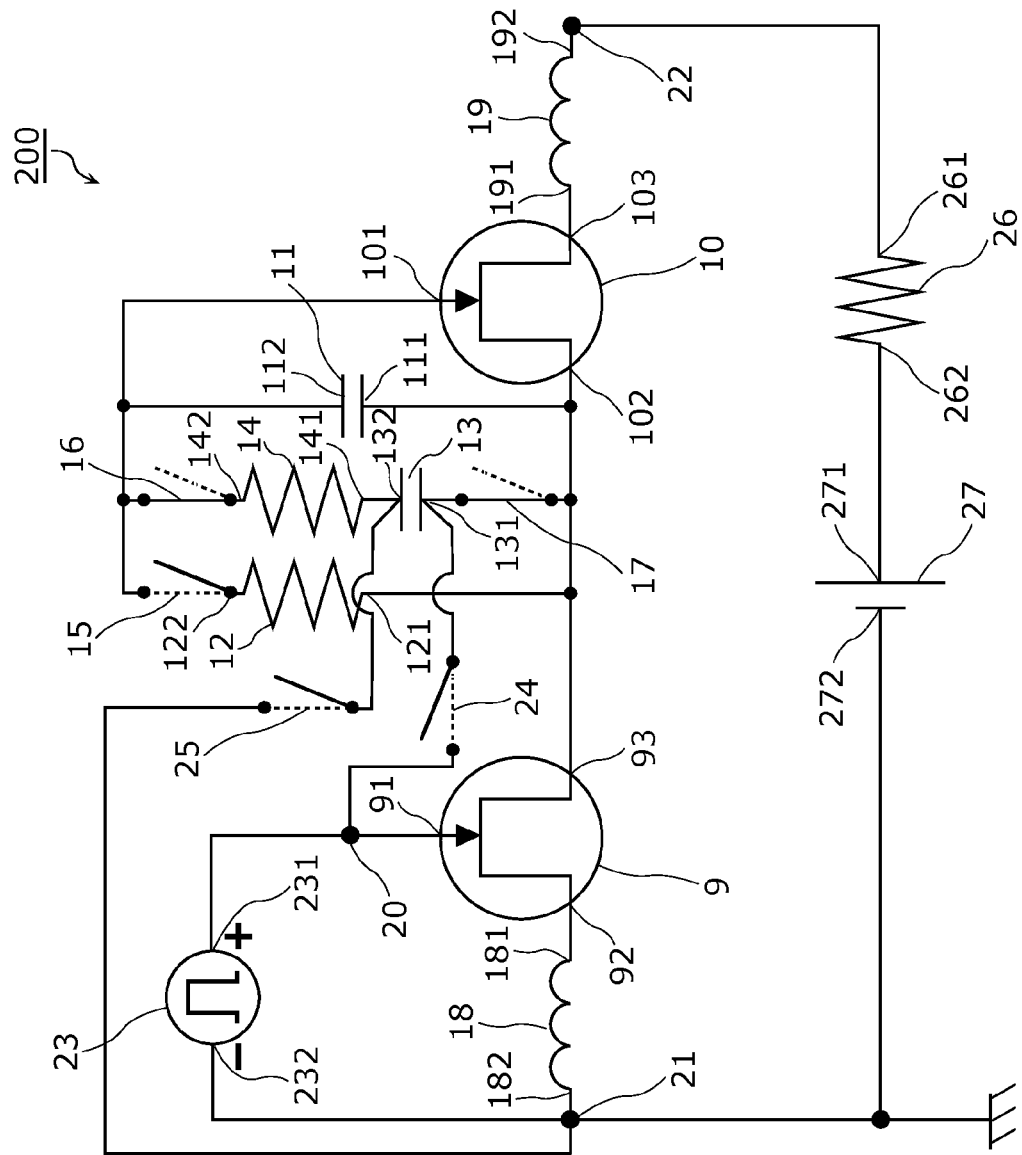
FIG. 3 illustrates an equivalent circuit of the semiconductor device according to Embodiment 1.

FIG. 3 is a circuit diagram of the equivalent circuit of the semiconductor device 100.

An equivalent circuit 200 includes a first transistor 9, a second transistor 10, a first capacitor 11, a first resistor 12, a second capacitor 13, a second resistor 14, a first inductor 18, a second inductor 19, a first switch 15, a second switch 16, a third switch 17, a fourth switch 24, and a fifth switch 25. Further, a first electrode 20 is an electrode corresponding to the gate electrode 7 of the semiconductor device 100, a second electrode 21 is an electrode corresponding to the source electrode 5 of the semiconductor device 100, and a third electrode 22 is an electrode corresponding to the drain electrode 6 of the semiconductor device 100.

It should be noted that although not included in the equivalent circuit 200, a pulse power supply 23, a drain load 26, and a direct current (DC) power supply 27 are shown for convenience, since they are necessary for a simulation performed using the equivalent circuit 200.

In the description below, a circuit which includes the equivalent circuit 200, the pulse power supply 23, the drain load 26, and the DC power supply 27 may be referred to as an equivalent circuit used for a simulation of electrical properties of the semiconductor device 100.

A feature of the equivalent circuit 200 is that the second transistor 10 is added in order to reproduce a current collapse phenomenon, in addition to the first transistor 9 exhibiting basic properties of the semiconductor device 100. It can be said in a sense that the second transistor is a virtual transistor.

Furthermore, based on the findings made by the inventors of the present application, an integration circuit (charging and discharging circuit) corresponding to a trap triggering a current collapse phenomenon is provided between the second gate electrode 101 and the second source electrode 102 of the second transistor 10. This enables a simulation of a current collapse phenomenon of the semiconductor device 100 with even higher precision, by using the equivalent circuit 200, as will be described below. The integration circuit means the first capacitor 11, the second capacitor 13, the first resistor 12, the second resistor 14, the first switch 15, the second switch 16, and the third switch 17.

Next is a detailed description of constituent elements of the equivalent circuit 200.

<First Transistor>

The first transistor 9 has a first gate electrode 91, a first source electrode 92, and a first drain electrode 93. The first drain electrode 93 and a second source electrode 102 of the second transistor 10 are electrically connected.

The first transistor 9 is a normally-off transistor. A normally-off transistor means a transistor in which the first source electrode 92 and the first drain electrode 93 are not brought into a conductive state (an OFF state) when a voltage applied to the first gate electrode 91 is 0 relative to the voltage at the first source electrode 92.

In addition, a threshold voltage of the first transistor 9 (a voltage applied to the first gate electrode 91 relative to the voltage at the first source electrode 92 in order to bring the first transistor 9 into an ON state) is a positive voltage.

<Second Transistor>

The second transistor 10 has the second gate electrode 101, the second source electrode 102, and a second drain electrode 103. The second source electrode 102 and the first drain electrode 93 are electrically connected.

The second transistor 10 has characteristics different from those of the first transistor 9 in the points below.

First, the second transistor 10 is a normally-on transistor, unlike the first transistor 9. A normally-on transistor means a transistor in which the second source electrode 102 and the second drain electrode 103 are brought into the conductive state (ON state) when a voltage applied to the second gate electrode 101 is 0 relative to the voltage at the second source electrode 102.

Specifically, a threshold voltage (a voltage applied to the second gate electrode 101 relative to the voltage at the second source electrode 102 in order to bring the second transistor 10 into the ON state) of the second transistor 10 is a negative voltage, which differs from that of the first transistor 9.

Furthermore, in the first transistor 9, a value of capacitance between the first gate electrode 91 and the first source electrode 92 is a finite value greater than 0, which depends on the potential difference between the first gate electrode 91 and the first source electrode 92. A value of capacitance between the first gate electrode 91 and the first drain electrode 93 is a finite value greater than 0, which depends on the potential difference between the first gate electrode 91 and the first drain electrode 93. A value of capacitance between the first source electrode 92 and the first drain electrode 93 is a finite value greater than 0, which depends on the potential difference between the first source electrode 92 and the first drain electrode 93.

In contrast, in the second transistor 10, the value of capacitance between the second gate electrode 101 and the second source electrode 102, the value of capacitance between the second gate electrode 101 and the second drain electrode 103, and the value of capacitance between the second source electrode 102 and the second drain electrode 103 are always 0.

The transconductance of the second transistor 10 is significantly lower than the transconductance of the first transistor 9. A transconductance is a value obtained by differentiating the value of current flowing from a drain electrode to a source electrode with respect to the value of a gate voltage. Here, "significantly low" means 1/100 or less.

<First Capacitor and Second capacitor>

The first capacitor 11, the first resistor 12, and the second resistor 14 and the second capacitor 13 are connected in parallel to one another, between the second gate electrode 101 and the second source electrode 102 of the second transistor 10.

Specifically, a terminal 112 of the first capacitor 11 is electrically connected to the second gate electrode 101, and another terminal 111 of the first capacitor 11 is electrically connected to the second source electrode 102.

A terminal 131 of the second capacitor 13 is electrically connected to the third switch 17, and another terminal 132 of the second capacitor 13 is electrically connected to a terminal 141 of the second resistor 14.

<First Resistor 12, Second Resistor 14, and Switches>

A terminal 121 of the first resistor 12 is electrically connected to the second source electrode 102, and another terminal 122 of the first resistor 12 is electrically connected to the first switch 15.

A terminal 141 of the second resistor 14 is electrically connected to the other terminal 132 of the second capacitor 13, and another terminal 142 of the second resistor 14 is electrically connected to the second switch 16.

The first to fifth switches are so-called single-pole single-throw (one-circuit, one contact) ideal switches.

A terminal of the first switch 15 is electrically connected to the second gate electrode 101, and the other terminal of the first switch 15 is electrically connected to another terminal 122 of the first resistor 12.

Thus, the electrical connection between the other terminal 122 of the first resistor 12 and the second gate electrode 101 is controlled by changing on (conductive state) and off (non-conductive state) of the first switch 15.

One terminal of the second switch 16 is electrically connected to the second gate electrode 101, and the other terminal of the second switch 16 is electrically connected to the other terminal 142 of the second resistor 14.

Thus, the electrical connection between the other terminal 142 of the second resistor 14 and the second gate electrode 101 is controlled by changing on and off of the second switch 16. In addition, the second switch 16 controls electrical connection between the other terminal 132 of the second capacitor 13 and the second gate electrode 101.

One terminal of the third switch 17 is electrically connected to the second source electrode 102, and the other terminal of the third switch 17 is electrically connected to a terminal 131 of the second capacitor 13.

Thus, electrical connection between the terminal 131 of the second capacitor 13 and the second source electrode 102 is controlled by changing on and off of the third switch 17.

One terminal of the fourth switch 24 is electrically connected to the first gate electrode 91, and the other terminal of the fourth switch 24 is electrically connected to the terminal 131 of the second capacitor 13.

Therefore, the electrical connection between the terminal 131 of the second capacitor 13 and the first electrode 20 is controlled by changing on and off of the fourth switch 24.

One terminal of the fifth switch 25 is electrically connected to the second electrode 21, and the other terminal of the fifth switch 25 is electrically connected to the other terminal 132 of the second capacitor 13.

Thus, the electrical connection between the other terminal 132 of the second capacitor 13 and the second electrode 21 is controlled by changing on and off of the fifth switch 25.

<First Inductor>

The first inductor 18 is an inductor representing what is called source parasitic inductance. Specifically, the first inductor 18 exhibits characteristics of exerting influence on a temporal change in a current flowing from the drain electrode to the source electrode observed when a gate voltage rapidly rises and falls in the semiconductor device 100. The first inductor 18 represents a sum of inductance of the source electrode 5 of the semiconductor device 100, inductance of a package which houses the semiconductor device 100, and inductance of a wire electrically connecting the source electrode 5 of the semiconductor device 100 to the package, for example.

A terminal 181 of the first inductor 18 is electrically connected to the first source electrode 92. Another terminal 182 of the first inductor 18 is electrically connected to the second electrode 21.

<Second Inductor>

The second inductor 19 is an inductor representing what is called drain parasitic inductance. Specifically, the second inductor 19 exhibits characteristics of exerting influence on a temporal change in a current flowing from the drain electrode to the source electrode observed when a gate voltage rapidly rises and falls in the semiconductor device 100, as with the first inductor 18. The second inductor 19 represents a sum of inductance of the drain electrode 6 of the semiconductor device 100, inductance of a package which houses the semiconductor device 100, and inductance of a wire electrically connecting the drain electrode 6 of the semiconductor device 100 to the package, for example.

A terminal 191 of the second inductor 19 is electrically connected to the second drain electrode 103. Another terminal 192 of the second inductor 19 is electrically connected to the third electrode 22.

<Second Electrode, Third Electrode, DC Power Supply>

The second electrode 21 is electrically connected to the ground. The third electrode 22 is electrically connected to a terminal 261 of the drain load 26. Another terminal 262 of the drain load 26 is electrically connected to a positive terminal 271 of the DC power supply 27. A negative terminal 272 of the DC power supply 27 is electrically connected to the second electrode 21.

<Pulse Power Supply>

In order to simulate a temporal change in the electrical properties of constituent elements included in the equivalent circuit 200, it is necessary to include, between the first electrode 20 and the second electrode 21, the pulse power supply 23 which applies a pulse voltage. The following is a description of a connection relation between the pulse power supply 23 and the equivalent circuit 200.

A positive terminal 231 of the pulse power supply 23 is electrically connected to the terminal 131 of the second capacitor 13 via the fourth switch 24. A negative terminal 232 of the pulse power supply 23 is electrically connected to the other terminal 132 of the second capacitor 13 via the fifth switch 25.

With such a connection relation, the pulse power supply 23 can apply a voltage across the terminal 131 and the other terminal 132 of the second capacitor 13, and charge the second capacitor 13.

The positive terminal 231 of the pulse power supply 23 is electrically connected to the first electrode 20. The negative terminal 232 of the pulse power supply 23 is electrically connected to the second electrode 21.

Such a connection relation allows the pulse power supply 23 to control on and off of the operation of the first transistor 9 by setting a high level of the pulse power supply 23 to a threshold voltage of the first transistor 9 or higher, and a low level to a voltage lower than the threshold voltage of the first transistor 9.

<Simulation Method>

Next is a description of a simulation method performed using the equivalent circuit 200 illustrated in FIG. 3.

Figure 4:
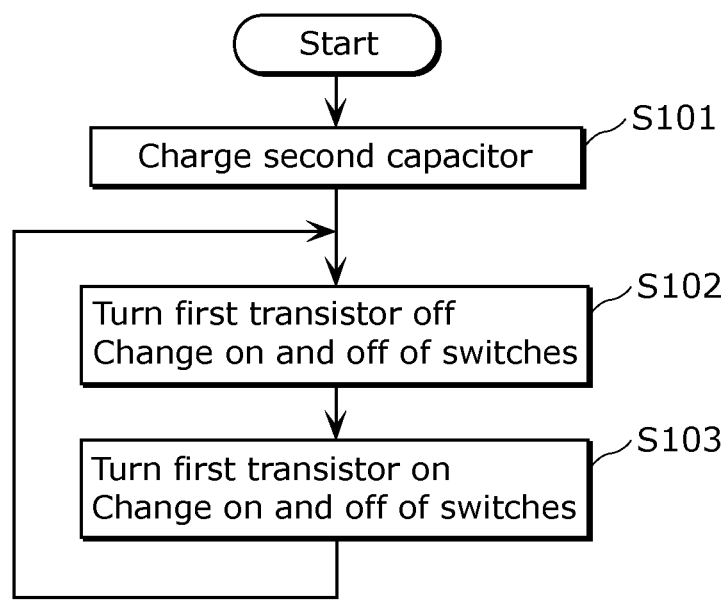
FIG. 4 is a flowchart of a simulation method according to Embodiment 1.

FIG. 4 is a flowchart of a simulation method according to the present embodiment.

FIG. 5 illustrates states of the switches during a simulation.

In the present embodiment, a description is given of a simulation method for simulating a temporal change in a current flowing between the drain electrode 6 and the source electrode 5 while the semiconductor device 100 is performing continuous switching operation. It should be noted that in the present embodiment, continuous switching operation is an operation in which a voltage pulse of a predetermined frequency is applied between the gate electrode 7 and the source electrode 5, and the ON state and the OFF state are periodically repeated in the semiconductor device 100.

Specifically, continuous switching operation is reproduced by the pulse power supply 23 outputting a voltage pulse of a predetermined frequency in the equivalent circuit 200. Here, the high level of the pulse power supply 23 corresponds to a voltage greater than or equal to the threshold voltage of the first transistor 9. The low level of the pulse power supply 23 corresponds to a voltage lower than the threshold voltage of the first transistor 9.

First, the second capacitor 13 is charged (S101 in FIG. 4).

Here, the magnitude of a voltage applied to the second capacitor 13 is the high-level voltage of the pulse power supply 23. Thus, the terminal 131 of the second capacitor 13 is positively charged according to the high-level voltage, and the other terminal 132 of the second capacitor 13 is negatively charged.

Next, the pulse power supply 23 applies the low level voltage across the first electrode 20 (the first gate electrode 91) and the second electrode 21 (the first source electrode 92) (S102 in FIG. 4). At the same time when the low level voltage is applied across the first electrode 20 and the second electrode 21 (at the time when the output of the pulse power supply 23 drops from the high level to the low level), the first switch 15 is turned off, the second switch 16 is turned on, the third switch 17 is turned on, the fourth switch 24 is turned off, and the fifth switch 25 is turned off, as illustrated in FIG. 5.

This starts charging the first capacitor 11. Specifically, the first capacitor 11 gradually stores the electric charge from the second capacitor 13 with a first time constant determined based on the resistance value of the second resistor 14 and the capacitance value of the first capacitor 11 (first circuit).

Figure 6:
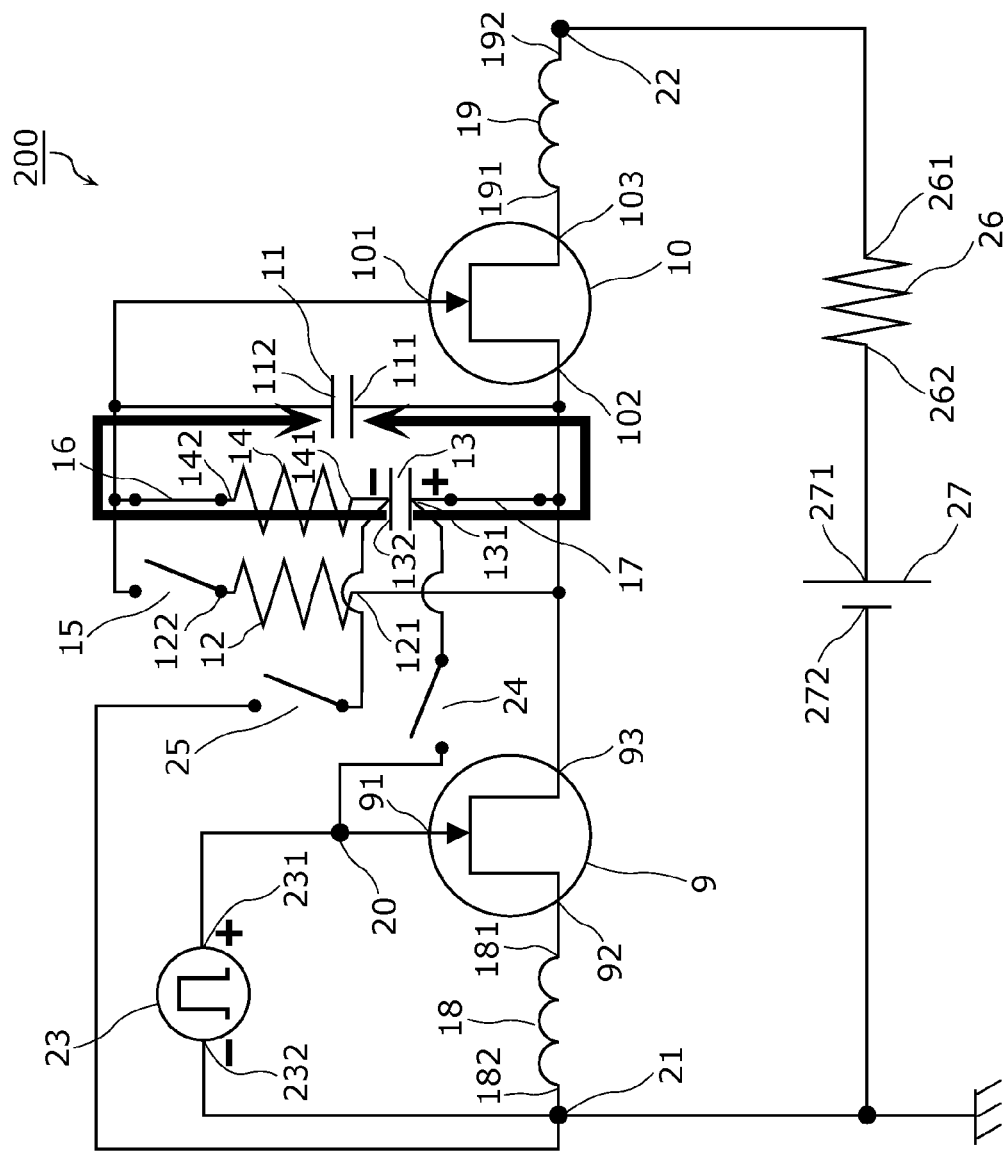
FIG. 6 illustrates charge paths to a first capacitor.

FIG. 6 illustrates charge paths (thick directional lines) to the first capacitor 11.

As illustrated in FIG. 6, the other terminal 111 of the first capacitor 11 is positively charged, and the terminal 112 of the first capacitor 11 is negatively charged. Accordingly, the potential of the second gate electrode 101 gradually becomes negative with respect to the second source electrode 102.

As a result, a current flowing from the second drain electrode 103 to the second source electrode 102 according to the first time constant decreases gradually in the second transistor 10. Eventually, the second transistor 10 will be in the OFF state, and will not have a current flow between the second drain electrode 103 and the second source electrode 102.

At this time, the low level voltage is applied across the first gate electrode 91 and the first source electrode 92, thereby bringing the first transistor 9 into the OFF state. Here, as described above, parasitic capacitance is present between the electrodes of the first transistor 9, and electric charge is stored in the parasitic capacitance when the first transistor 9 is in the ON state. Accordingly, following a decrease in a current flowing from the second drain electrode 103 to the second source electrode 102, a current flowing from the third electrode 22 to the second electrode 21 also decreases. Thus, in a current collapse phenomenon, the electric charge is released from traps, thereby reproducing a delay which occurs during switching-off.

Next, the high-level voltage is applied across the first electrode 20 and the second electrode 21 by the pulse power supply 23 (S103 in FIG. 4). At the same time when the high-level voltage is applied across the first electrode 20 and the second electrode 21 (at the time when the output of the pulse power supply 23 rises from the low level to the high level), the first switch 15 is turned on, the second switch 16 is turned off, the third switch 17 is turned off, the fourth switch 24 is turned on, and the fifth switch 25 is turned on, as illustrated in FIG. 5.

Then, this starts discharging the first capacitor 11. Specifically, the electric charge stored in the first capacitor 11 is discharged to the ground via the first resistor 12, the first transistor 9, and the first inductor 18 with a second time constant determined based on the capacitance value of the first capacitor 11 and the resistance value of the first resistor 12 (the second circuit).

Figure 7:
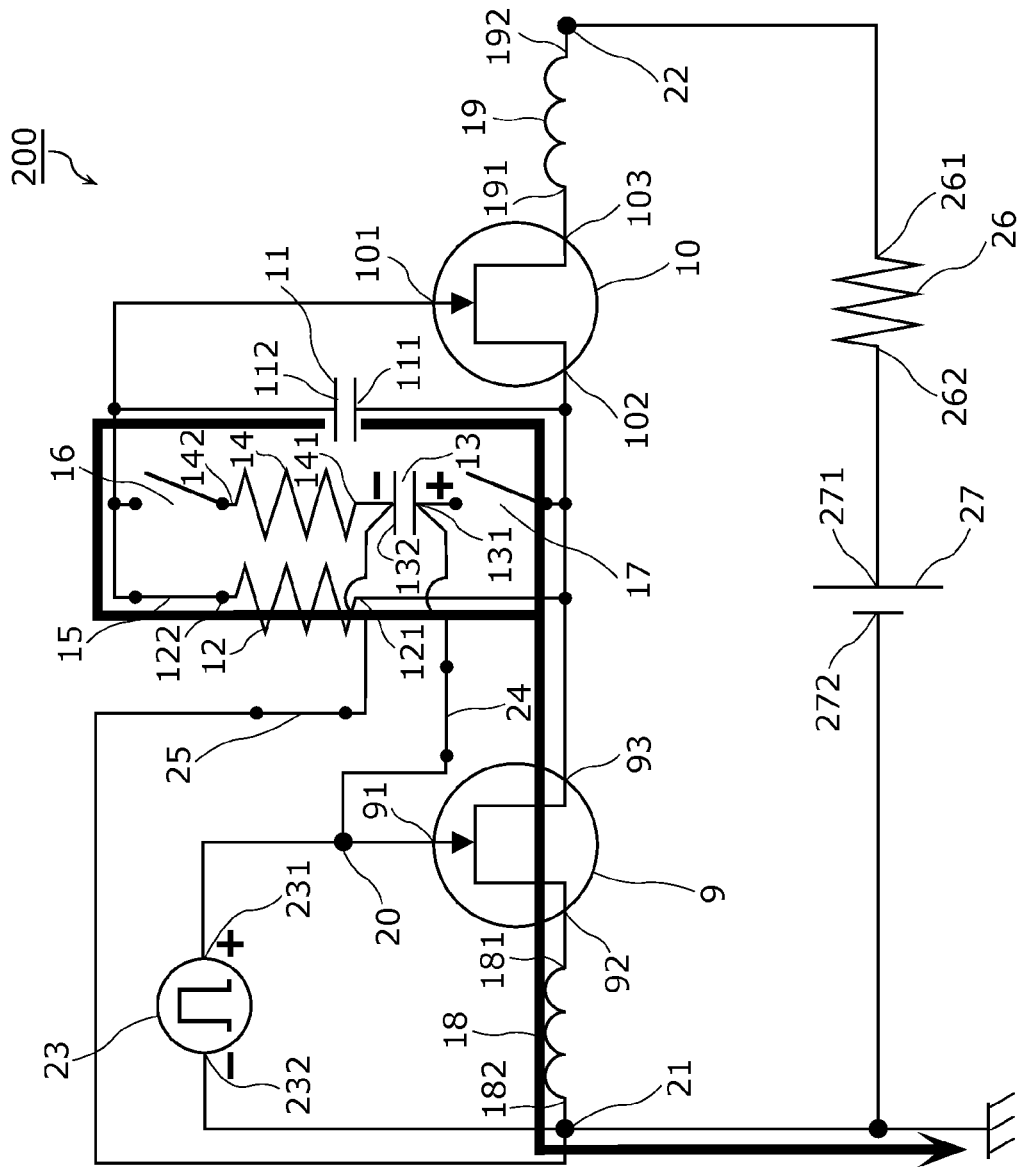
FIG. 7 illustrates a discharge path of electric charges stored in the first capacitor.

FIG. 7 illustrates a discharge path (thick directional line) of the electric charge stored in the first capacitor 11.

As illustrated in FIG. 7, the potential difference between the second gate electrode 101 and the second source electrode 102 decreases gradually due to the discharge of electric charge stored in the first capacitor 11.

When the potential of the second gate electrode 101 relative to the second source electrode 102 is lower than the threshold voltage of the second transistor 10, a current starts to flow from the second drain electrode 103 to the second source electrode 102. Specifically, the current flowing between the second drain electrode 103 and the second source electrode 102 increases gradually according to the second time constant.

At this time, the high-level voltage is applied across the first gate electrode 91 and the first source electrode 92, thereby bringing the first transistor 9 into the ON state. Accordingly, following an increase in a current flowing from the second drain electrode 103 to the second source electrode 102, a current flowing from the third electrode 22 to the second electrode 21 also increases. Consequently, electric charge is captured by traps in a current collapse phenomenon, thereby reproducing the delay which occurs during switching-on.

In step S103, the high-level voltage is applied to the second capacitor 13 by the pulse power supply 23. Thus, the terminal 131 of the second capacitor 13 is positively charged according to the high-level voltage, whereas the other terminal 132 of the second capacitor 13 is negatively charged, as with step S101.

After that, the operation in step S102 and the operation in step S103 are repeated alternately.

It should be noted that although the second capacitor 13 is charged in step S101 in FIG. 4, the first capacitor 11 may be charged in step S101. In this case, operation is performed in the following order: step S101, step S103, and step S102, and these steps are repeated alternately after that.

It should be noted that the second capacitor 13 serves as the power supply for charging the first capacitor 11, and is not an indispensable constituent element. Thus, a circuit configuration may be adopted in which the first capacitor 11 is directly charged by a power supply, for example.

<Method of Determining Circuit Parameter>

A description is now given of a method of determining values of capacitors and resistors in the equivalent circuit 200. It should be noted that in the description below, the state corresponding to that in step S102 in FIG. 4 is a switching OFF state, and the state corresponding to that in step S103 in FIG. 4 is a switching ON state.

Parameters (static characteristics and others) of the first transistor 9 are determined by measuring the static characteristic of the semiconductor device 100.

Parameters of the second transistor 10 are arbitrarily determined within a range of values which do not to exert an influence on the static characteristic of the first transistor 9.

A capacitance value C1 of the first capacitor 11 is a given value (for example, referred to as 1 nF).

A capacitance value C2 of the second capacitor 13 is set to a value greater than the capacitance value C1 of the first capacitor 11. For example, the capacitance value C2 of the second capacitor 13 is at least 100 times the capacitance value C1 of the first capacitor 11. That is because there are cases where the voltage applied across the two terminals of the first capacitor 11 does not bring the second transistor into the OFF state when the electric charge stored in the second capacitor 13 is discharged, if the capacitance value C1 of the first capacitor 11 and the capacitance value C2 of the second capacitor 13 are values close to each other.

For example, if C1 and C2 are the same values, as shown by Expressions (1) and (2) below, half the voltage applied across the two terminals of the second capacitor 13 in step S101 (or step S103) in FIG. 4 is applied across the two terminals of the first capacitor 11 in step S102 in FIG. 4.

[Math 1]

$$Q = C1 \times V1 = C2 \times V2 \qquad \text{Expression 1}$$

[Math 2]

$$V1 = C2/C1 \times V2 \qquad \text{Expression 2}$$

Here, Q denotes half the amount of charge stored in the second capacitor 13 in the switching OFF state, C1 denotes the capacitance value of the first capacitor 11, V1 denotes a voltage across the two terminals of the first capacitor 11 in the switching ON state, C2 denotes the capacitance value of the second capacitor 13, and V2 denotes a voltage across the two terminals of the second capacitor 13 in the switching ON state.

As described above, in the case of C1=C2, V1 is equal to V2, and V1 plus V2 is a voltage applied to the second capacitor 13 in the switching OFF state. Thus, each of V1 and V2 is half the voltage applied to the second capacitor 13.

However, in the case of C1×100=C2, V1 is equal to 100× V2, and a voltage obtained by distributing a voltage applied to the second capacitor 13 in the switching OFF state at the ratio of 100 to 1 is applied across the two terminals of the first capacitor 11 in the switching ON state.

Specifically, in the switching ON state, 100/101 of a voltage applied to the second capacitor 13 in the switching OFF state is applied across the two terminals of the first capacitor 11.

In this way, the greater C2 is than C1, the higher voltage is applied to the first capacitor 11.

The values of resistors are obtained by measuring a time constant in each of the switching ON state and the switching OFF state of the semiconductor device 100.

A time constant t1 in the switching ON state is shown as Expression 3 below, based on the capacitance value C1 of the first capacitor 11 and a resistance value R1 of the first resistor 12.

[Math 3]

$$t1 = R1 \times C1 \quad \text{Expression 3}$$

Accordingly, the resistance value R1 of the first resistor 12 is obtained by dividing the time constant t1 measured in the switching OFF state by the capacitance value C1 of the first capacitor 11.

Similarly, a time constant t2 in the switching OFF state is shown as Expression 4 below, based on the capacitance value C1 of the first capacitor 11 and a resistance value R2 of the second resistor 14.

[Math 4]

$$t2 = R2 \times C1 \quad \text{Expression 4}$$

Accordingly, the resistance value R2 of the second resistor 14 is obtained by dividing the time constant t2 measured in the switching ON state by the capacitance value C2 of the second capacitor 13.

It should be noted that the time constants t1 and t2 here denote a time period for a value at the moment when the state of a current flowing from the third electrode 22 to the second electrode 21 is switched to reach 1/e (base of a natural logarithm), or specifically, 37%.

The equivalent circuit 200 having the circuit parameters determined as described above allows a simulation of a temporal change in the current flowing between the drain electrode 6 and the source electrode 5 to be performed in consideration of the current collapse phenomenon of the semiconductor device 100 during continuous switching operation.

It should be noted that as described above, a current collapse phenomenon is a temperature dependent phenomenon. Accordingly, the resistance value of the first resistor 12 and the resistance value of the second resistor 14 are made temperature dependent, thereby enabling a simulation of a current collapse phenomenon, including temperature dependence.

There are two types of expressions indicating temperature dependence of a resistor. One is an expression using a linear function as shown in Expression 5. The other is an expression using an exponential function, as shown in Expression 6.

[Math 5]

$$R(T) = R \times (1 + TC1 \times (T - T\text{nom}) + TC2 \times (T - T\text{nom})^2) \quad \text{Expression 5}$$

[Math 6]

$$R(T) = R \times 1.01 \times (TCE \times (T - T\text{nom})) \quad \text{Expression 6}$$

Here, TC1 denotes a primary linear coefficient, TC2 is a secondary linear coefficient, and TCE is a factor of an exponential function. Tnom denotes a temperature used as a reference, and R denotes a resistance value when the temperature is Tnom. Which of these two expressions is to be selected is determined by comparing a measured value with a simulation result of the temperature dependence of a current flowing from the second drain electrode 103 to the second source electrode 102 in each of the switching ON state and the switching OFF state.

<Simulation Device>

It should be noted that the equivalent circuit 200 may be achieved as hardware by providing constituent elements of the equivalent circuit 200 on a substrate, or may be achieved as circuit information.

The following is a description of a simulation device which executes the simulation method shown in the flowchart of FIG. 4, using the equivalent circuit 200 as circuit information.

First is a description of the equivalent circuit 200 achieved as circuit information.

The circuit information here is data indicating a connection relation, circuit constants, and others of the constituent elements of the equivalent circuit 200.

FIG. 8 illustrates a netlist which is an example of circuit information.

The netlist shown in FIG. 8 represents an electric network used in the simulation program with integrated circuit emphasis (SPICE) which is general circuit simulation software. Thus, with such a netlist, electrical properties of the semiconductor device 100 can be calculated using SPICE.

It should be noted that circuit information is not limited to a netlist, and may be information obtained by recording the connection relation and circuit constants of the circuit elements of the equivalent circuit 200, as described above.

Next is a description of the configuration of a simulation device.

Figure 9:
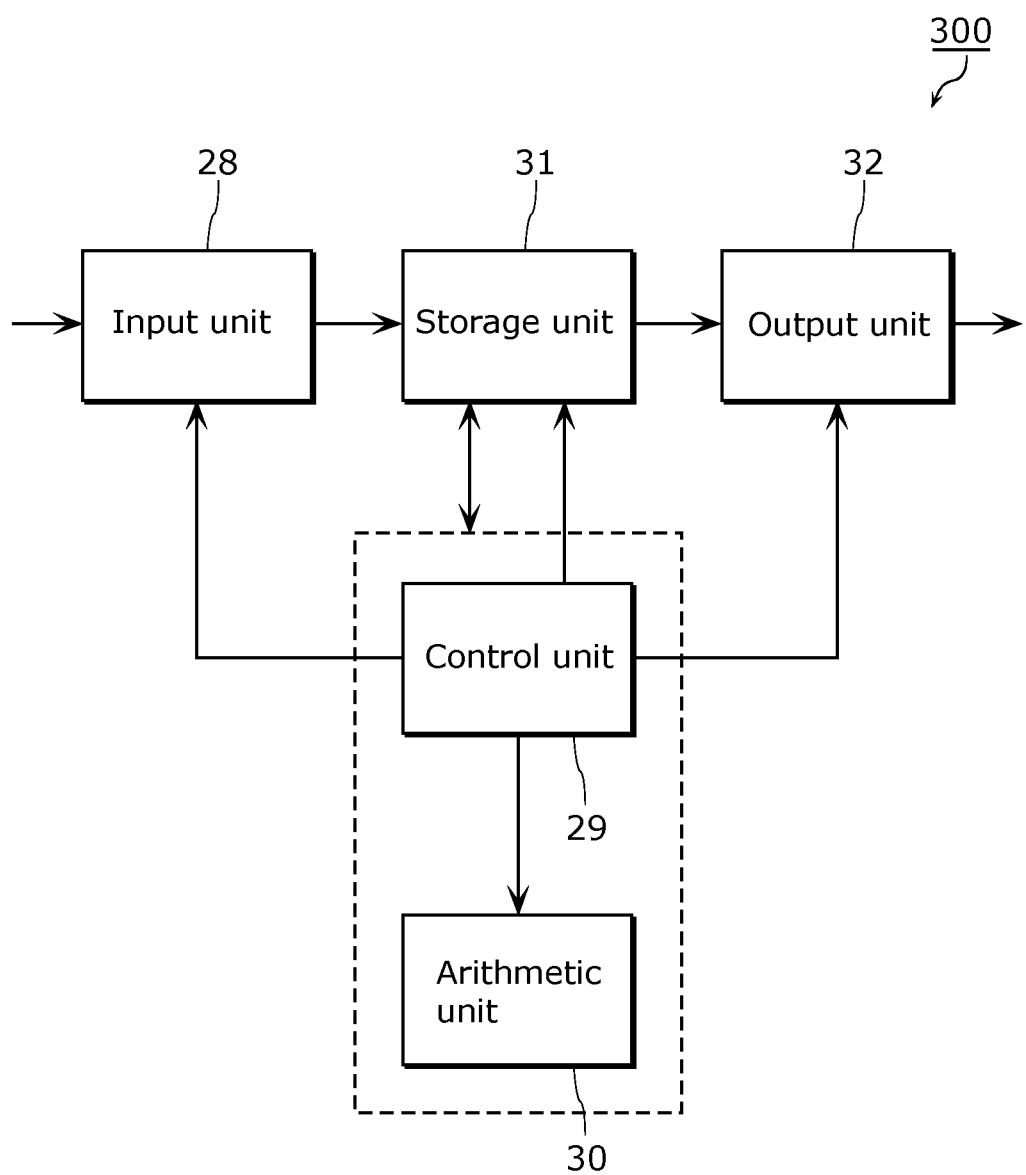
FIG. 9 is a block diagram illustrating a configuration of a simulation device according to Embodiment 1.

FIG. 9 illustrates a configuration of a simulation device according to the present embodiment.

As illustrated in FIG. 9, a simulation device 300 includes an input unit 28, a control unit 29, an arithmetic unit 30, a storage unit 31, and an output unit 32.

The input unit 28 accepts input of information on a simulation. Information on a simulation is a circuit parameter, a simulation time, and the like, for example.

Circuit parameters indicate characteristics and constants of circuit elements of the equivalent circuit 200. Circuit parameters are, for example, a threshold voltage, transconductance, capacitance values between electrodes, and others which determine characteristics of a transistor. In addition, circuit parameters include capacitance values of capacitors, resistance values of resistors, and inductances of inductors. Circuit parameters also include, for instance, values of voltages applied to the first electrode 20, the second electrode 21, and the third electrode 22.

In the above description, the second capacitor 13 is charged in step S101 in FIG. 4, and circuit parameters also include the amount of charge stored in the second capacitor 13. Specifically, with the simulation device 300, a user can input a specific figure indicating the amount of charge stored in the second capacitor 13 (a value of a voltage applied to the second capacitor 13) to the input unit 28. The same also applies to the amount of charge stored in the first capacitor 11.

Circuit parameters may be included in the circuit information as the above-mentioned netlist. In this case, the user does not need to input the circuit parameters included in the circuit information.

A simulation time is a time period for which a simulation result is to be obtained. For example, 100 ms is a simulation time if the result until 100 ms elapses after circuit operation starts is to be obtained.

The input unit 28 includes, for example, a keyboard which accepts user input, a scanner which reads text indicating the circuit parameters and the simulation time mentioned above, and the like.

Based on information on a simulation inputted to the input unit 28, and the circuit information of the equivalent circuit 200 and a program stored in the storage unit 31, the control unit 29 gives instructions to the arithmetic unit 30 described below to calculate (compute) a current flowing through each component of the equivalent circuit 200 and a voltage at each terminal. Specifically, the control unit 29 gives instructions to the arithmetic unit 30 to calculate a current flowing through each component of the equivalent circuit 200 and a voltage at each terminal of the components (arithmetic values at each time step) at each of time steps from when a simulation starts until when the simulation ends.

In addition, the control unit 29 obtains, from the storage unit 31 described below, computed values at each time step stored in the storage unit 31, and transfers the values to the arithmetic unit 30.

In addition, the control unit 29 stores the computed values at each time step obtained by the arithmetic unit 30 into the storage unit 31.

The control unit 29 includes a central processing unit (CPU), for example.

The arithmetic unit 30 calculates (computes) a current flowing between terminals of the components of the equivalent circuit 200 and a voltage at each terminal thereof at each time step, from the circuit information and circuit parameters of the equivalent circuit 200. The arithmetic unit 30 includes an arithmetic logic unit (ALU), for example.

The storage unit 31 stores therein the equivalent circuit 200 as circuit information, and also a program for executing the simulation method illustrated in FIG. 4. The storage unit 31 stores the arithmetic values at each time step. The storage unit 31 includes primary memory such as semiconductor memory, secondary memory such as a hard disk, or the like.

The output unit 32 outputs the computed values at each of the time steps from when a simulation starts until when the simulation ends. The output unit 32 includes a display unit such as a monitor, a printer, and the like, for example.

It should be noted that the simulation device 300 may be formed dedicated to simulation by the semiconductor device 100, or may be achieved as a function of a workstation or a personal computer, for example.

<Simulation Result>

Figure 10:
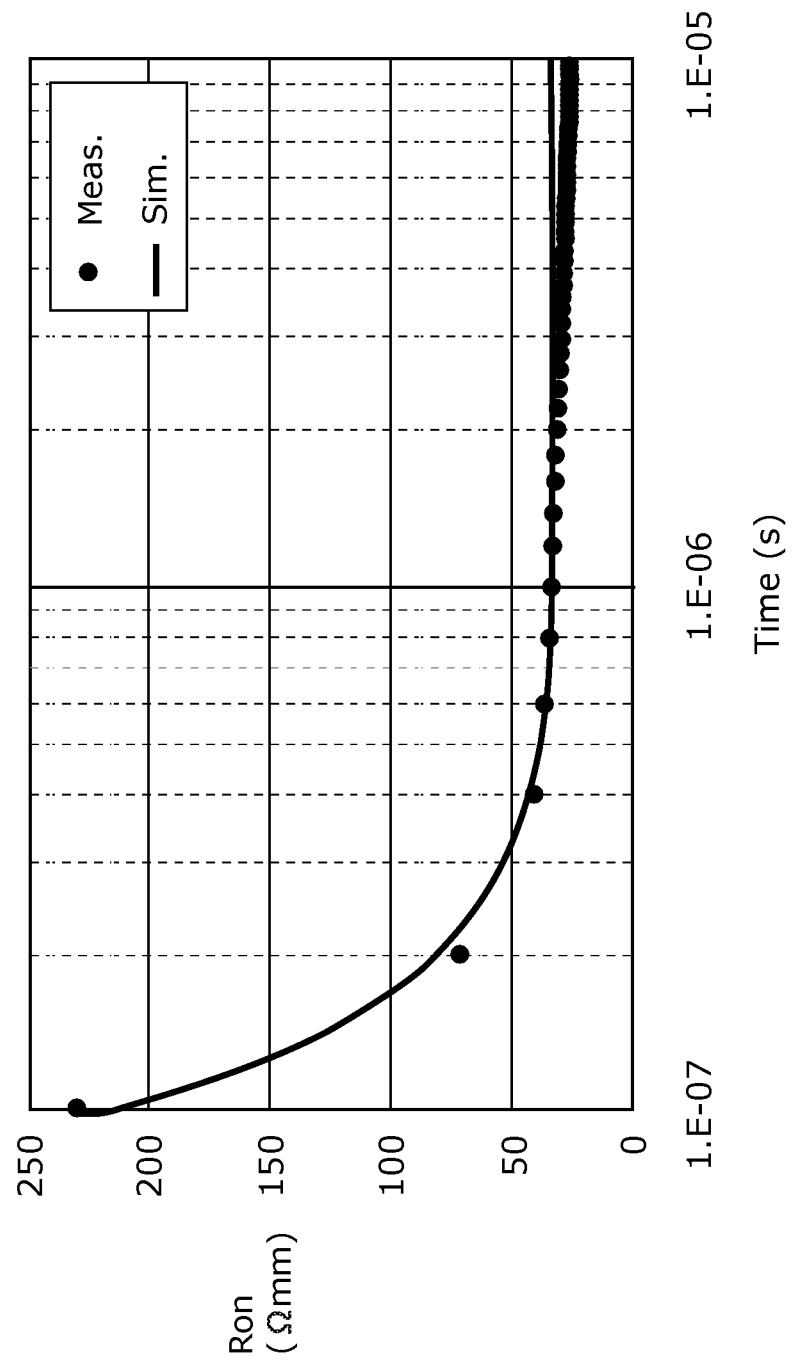
FIG. 10 is a first diagram illustrating results of simulations performed using the equivalent circuit.

FIG. 10 illustrates simulation results obtained using the equivalent circuit 200.

The vertical axis in FIG. 10 represents the on resistance (Ron, unit: Ωmm) of a semiconductor device, and the horizontal axis represents time periods (unit: second) which elapses after the high-level voltage (voltage higher than or equal to the threshold voltage) is applied to the gate electrode 7 of the semiconductor device (the first electrode 20 in the case of the equivalent circuit 200).

Specifically, FIG. 10 illustrates a comparison between a temporal change in the on resistance when a simulation is performed using the equivalent circuit 200 (solid line) and a temporal change in the on resistance measured using the semiconductor device 100 (black dots).

As illustrated in FIG. 10, the simulation results obtained using the equivalent circuit 200 have little difference from the values measured using the semiconductor device 100. In other words, the use of the equivalent circuit 200 allows a simulation of the current collapse phenomenon of the semiconductor device 100 with high precision.

Figure 11A:
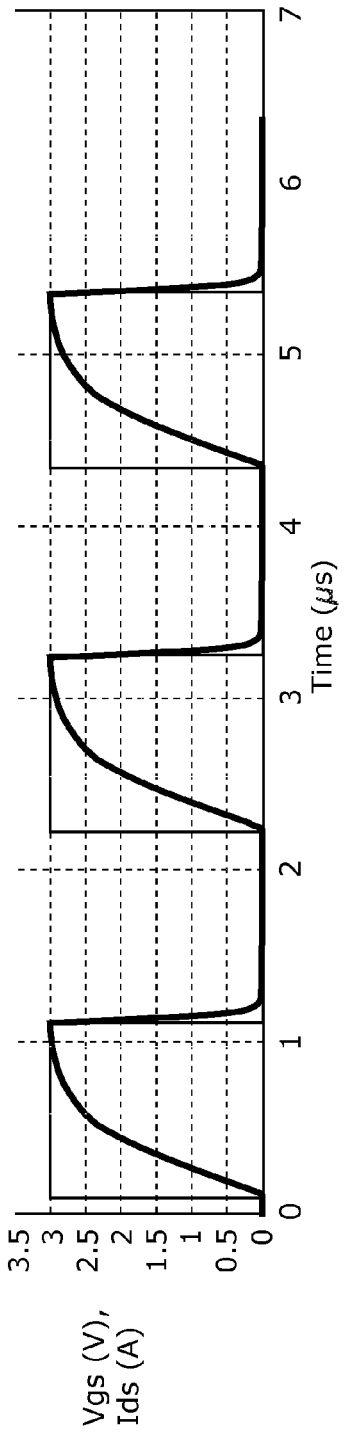
FIG. 11A is a second diagram illustrating a result of a simulation performed using the equivalent circuit.
Figure 11B:
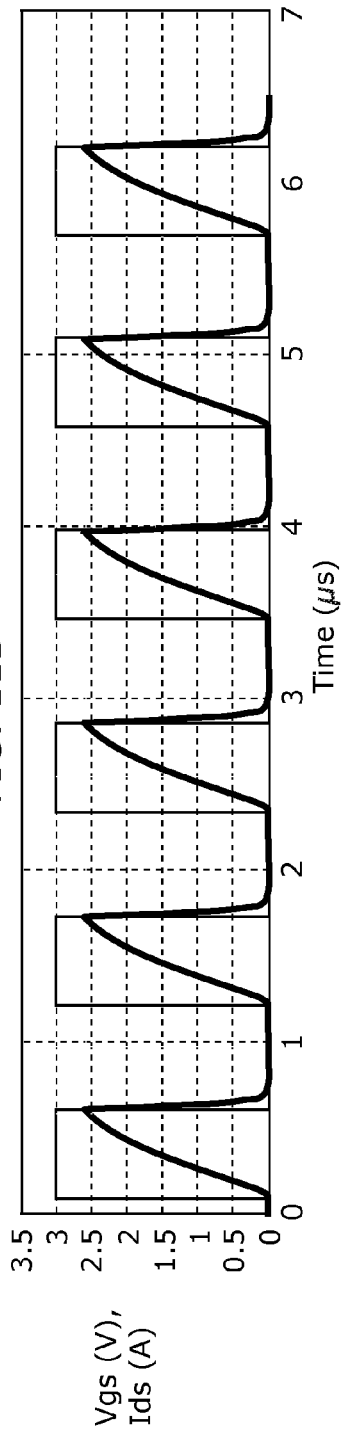
FIG. 11B is a second diagram illustrating a result of a simulation performed using the equivalent circuit.
Figure 11C:
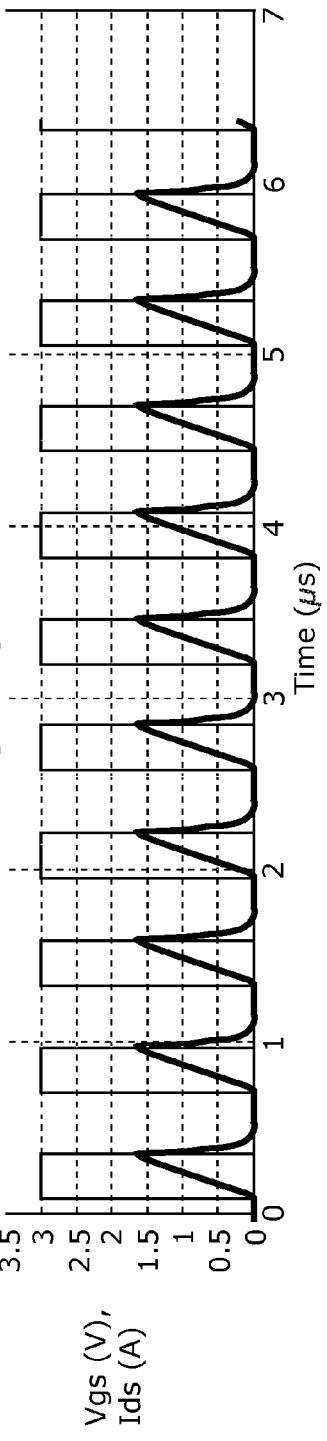
FIG. 11C is a second diagram illustrating a result of a simulation performed using the equivalent circuit.

FIGS. 11A to 11C are other diagrams illustrating simulation results obtained using the equivalent circuit 200.

FIGS. 11A to 11C each illustrate an output voltage (thin line) of the pulse power supply 23 applied to the first electrode 20 of the first transistor 9, and a temporal change in a current flowing from the third electrode 22 to the second electrode 21 (thick line). It should be noted that FIGS. 11A to 11C each illustrate the case where a frequency of the output voltage of the pulse power supply 23 is changed in the equivalent circuit having the same circuit parameters.

As illustrated in FIGS. 11A to 11C, in the equivalent circuit 200, the higher a frequency of the output voltage of the pulse power supply 23 is, the lower the peak of a current flowing from the third electrode 22 to the second electrode 21 is. This is a waveform typically observed in a current collapse phenomenon, and means that it is possible to perform simulations corresponding to input voltages of different frequencies by using one equivalent circuit 200.

As described above, the use of the equivalent circuit 200 according to the present embodiment allows the influence of a current collapse phenomenon in the switching operation of a power electronic circuit to be reproduced with high precision.

It is possible to reduce the number of times trial power electronics products are fabricated, by predicting the results of electrical properties due to a current collapse phenomenon. As a result, it is possible to significantly decrease a time and cost for developing power electronics products.

Each of the constituent elements in the above-described embodiment may be configured in the form of an exclusive hardware product, or may be realized by executing a software program suitable for the constituent element. Each of the constituent elements may be realized by means of a program executing unit, such as a CPU and a processor, reading and executing the software program recorded on a recording medium such as a hard disk or a semiconductor memory. Here, the software program for realizing the simulation device according to the embodiment above is a program described below.

Specifically, this program causes a computer to execute a simulation method for a semiconductor device performed using the equivalent circuit described in the above embodiment, the simulation method including: in a state where the second switch and the third switch are off and the second capacitor is charged to a first voltage, applying, across the first electrode and the second electrode, a voltage for bringing the first transistor from an ON state into an OFF state, and simultaneously, charging the first capacitor and bringing the second transistor from the OFF state into the ON state by turning off the first switch and turning on the second switch and the third switch; in a state where the first switch is off and the first capacitor is charged to a second voltage, applying, across the first electrode and the second electrode, a voltage for bringing the first transistor from the OFF state into the ON state, and simultaneously, discharging the first capacitor and bringing the second transistor from the ON state into the OFF state by turning on the first switch and turning off the second switch and the third switch; and obtaining a temporal change in a current flowing from the third electrode to the second electrode in each of the states.

Variation

Although a description is given based on the exemplary embodiment above, it is needless to say that the techniques disclosed herein are not limited to the above embodiment.

For example, although a normally-on transistor is used for the second transistor 10 in the present embodiment, it is also possible to use a normally-off transistor. In this case, a circuit configuration may be adopted in which the first transistor 9 is brought from the ON state into the OFF state, and simultaneously discharging the electric charge stored in the first capacitor 11 is started, whereas the first transistor 9 is brought from the OFF state into the ON state, and simultaneously charging the first capacitor 11 is started.

The cases as below are also included in the scope of the appended Claims and their equivalents.

(1) Specifically, each device described above may be achieved by a computer system which includes a microprocessor, a ROM, a RAM, a hard disk unit, a display unit, a keyboard, a mouse, and the like. A computer program is stored in the RAM or the hard disk unit. The operation of the microprocessor in accordance with the computer program allows each device to achieve its functionality. Here, the computer program includes a combination of instruction codes indicating instructions to a computer in order to achieve given functionality.

(2) Some or all of constituent elements included in each device described above may include a single system large scale integration (LSI: large scale integrated circuit). The system LSI is a super multi-function LSI manufactured by integrating multiple components in one chip, and is specifically a computer system configured so as to include a microprocessor, a ROM, a RAM, and so on. A computer program is stored in the RAM. The system LSI accomplishes its functions through the load of the computer program from the ROM to the RAM by the microprocessor and the operation of the microprocessor in accordance with the computer program.

(3) Some or all of constituent elements included in each device described above may include an IC card or a single module which can be attached to or detached from the device. The IC card or the module is a computer system which includes a microprocessor, a ROM, a RAM, and the like. The above super-multifunctional LSI may be included in the IC card or the module. The IC card or the module accomplishes its functions through the operation of the microprocessor in accordance with the computer program. This IC card or module may have tamper resistant properties.

(4) The techniques disclosed herein may be achieved by the methods described above. In addition, these methods may be achieved by a computer program implemented by a computer, or may be implemented by a digital signal which includes a computer program.

The techniques disclosed herein may be achieved by a computer program or a digital signal stored in a computer-readable recording medium such as, for example, a flexible disk, a hard disk, CD-ROM, MO, DVD, DVD-ROM, DVD-RAM, a blue-ray disc (BD), or a semiconductor memory. Alternatively, the techniques disclosed herein may be achieved by a digital signal stored in such a recording medium.

With the techniques disclosed herein, the computer program or the digital signal may be transmitted via, for instance, data broadcasting or a network typified by electric telecommunication lines, wireless or wired communication lines, and the Internet.

The present disclosure may be a computer system which includes a microprocessor and a memory, the memory may have stored therein a computer program, and the microprocessor may operate in accordance with the computer program.

Another independent computer system may implement a program or a digital signal which has been stored in a recording medium and transported thereto or a program or a digital signal transported via a network or the like.

(5) The above embodiments and the above variation may be combined.

Although the above is a description of an equivalent circuit of a semiconductor device according to one or more aspects based on the embodiments, the technique disclosed herein is not limited to the above embodiments. Various modifications to the embodiments that may be conceived by those skilled in the art and combinations of constituent elements in different embodiments may be included within the scope of the one or more aspects, without departing from the spirit of the present disclosure.

The herein disclosed subject matter is to be considered descriptive and illustrative only, and the appended Claims are of a scope intended to cover and encompass not only the particular embodiments disclosed, but also equivalent structures, methods, and/or uses.

INDUSTRIAL APPLICABILITY

According to the techniques disclosed herein, it is possible to simulate a temporal change in a current flowing in a switching device in consideration of a current collapse phenomenon with high precision, and the equivalent circuit of the semiconductor device, the simulation method for the semiconductor device, and the simulation device for the semiconductor device according to one or more exemplary embodiments disclosed herein are useful to the design of power electronic circuits in which the switching device is used.

The invention claimed is:

1. An equivalent circuit of a semiconductor device having a gate, a source, and a drain, the equivalent circuit comprising:
  a first transistor having a first source electrode, a first drain electrode, and a first gate electrode electrically connected to a first electrode corresponding to the gate of the semiconductor device;
  a second transistor having a second gate electrode, a second drain electrode, and a second source electrode electrically connected to the first drain electrode;
  a first capacitor having a terminal electrically connected to the second gate electrode, and another terminal electrically connected to the second source electrode;
  a first resistor and a first switch electrically connected in series, and having a terminal electrically connected to the second gate electrode and another terminal electrically connected to the second source electrode;
  a second resistor and a second capacitor electrically connected in series;
  a second switch having a terminal electrically connected to the second gate electrode, and another terminal electrically connected to a terminal of the second resistor and the second capacitor electrically connected in series;
  a third switch having a terminal electrically connected to the second source electrode, and another terminal electrically connected to another terminal of the second resistor and the second capacitor electrically connected in series;
a first inductor having a terminal electrically connected to the first source electrode, and another terminal electrically connected to a second electrode corresponding to the source of the semiconductor device; and
a second inductor having a terminal electrically connected to the second drain electrode, and another terminal electrically connected to a third electrode corresponding to the drain of the semiconductor device.

2. The equivalent circuit according to claim 1, wherein a resistance value of the first resistor and a resistance value of the second resistor each have a predetermined temperature characteristic.

3. The equivalent circuit according to claim 1, further comprising:
a pulse power supply having a positive terminal electrically connected to the first electrode, and a negative terminal electrically connected to the second electrode;
a fourth switch having a terminal electrically connected to the first electrode, and another terminal electrically connected to a terminal of the second capacitor; and
a fifth switch having a terminal electrically connected to the second electrode, and another terminal electrically connected to another terminal of the second capacitor.

4. The equivalent circuit according to claim 1,
wherein the first transistor is a normally-off transistor, and the second transistor is a normally-on transistor.

5. A simulation method for a semiconductor device performed using the equivalent circuit according to claim 1, the simulation method comprising:
in a state where the second switch and the third switch are off and the second capacitor is charged to a first voltage, applying, across the first electrode and the second electrode, a voltage for bringing the first transistor from an ON state into an OFF state, and simultaneously, charging the first capacitor and bringing the second transistor from the OFF state into the ON state by turning off the first switch and turning on the second switch and the third switch;
in a state where the first switch is off and the first capacitor is charged to a second voltage, applying, across the first electrode and the second electrode, a voltage for bringing the first transistor from the OFF state into the ON state, and simultaneously, discharging the first capacitor and bringing the second transistor from the ON state into the OFF state by turning on the first switch and turning off the second switch and the third switch; and
obtaining a temporal change in a current flowing from the third electrode to the second electrode in each of the states.

6. A simulation device for a semiconductor device, the simulation device comprising:
a storage unit configured to store therein the equivalent circuit according to claim 1 as circuit information, and a program for executing a simulation method for the semiconductor device;
an input unit configured to accept input of values of voltages to be applied to the first electrode, the second electrode, and the third electrode, and a value of a voltage to which the first capacitor is to be charged or a value of a voltage to which the second capacitor is to be charged; and an arithmetic unit configured to calculate an electrical property of the semiconductor device, using the circuit information, the program, and the input,
wherein the simulation method for the semiconductor device includes:
in a state where the second switch and the third switch are off and the second capacitor is charged to a first voltage, applying, across the first electrode and the second electrode, a voltage for bringing the first transistor from an ON state into an OFF state, and simultaneously, charging the first capacitor and bringing the second transistor from the OFF state into the ON state by turning off the first switch and turning on the second switch and the third switch;
in a state where the first switch is off and the first capacitor is charged to a second voltage, applying, across the first electrode and the second electrode, a voltage for bringing the first transistor from the OFF state into the ON state, and simultaneously, discharging the first capacitor and bringing the second transistor from the ON state into the OFF state by turning on the first switch and turning off the second switch and the third switch; and
obtaining a temporal change in a current flowing from the third electrode to the second electrode in each of the states.

7. A non-transitory recording medium having stored therein the equivalent circuit according to claim 1 as circuit information.

8. An equivalent circuit of a semiconductor device having a gate, a source, and a drain, the equivalent circuit simulating electrical properties of the semiconductor device, the equivalent circuit comprising:
a first transistor having a first gate electrode for simulating and corresponding to the gate of the semiconductor device, a first source electrode for simulating and corresponding to the source of the semiconductor device, and a first drain electrode;
a second transistor having a second gate electrode, a second source electrode electrically connected to the first drain electrode, and a second drain electrode for simulating and corresponding to the drain of the semiconductor device; and
a charging and discharging circuit which includes a first capacitor having a terminal electrically connected to the second gate electrode and another terminal electrically connected to the second source electrode, and charges and discharges the first capacitor with predetermined time constants.

9. The equivalent circuit according to claim 8, wherein the charging and discharging circuit includes:
a first circuit which determines the time constant with which the first capacitor is charged; and
a second circuit which determines the time constant with which the first capacitor is discharged.

10. The equivalent circuit according to claim 8, wherein the charging and discharging circuit includes a resistor which determines the time constant with which the first capacitor is charged or discharged.

11. The equivalent circuit according to claim 8, wherein the first gate electrode of the first transistor is not directly connected to the second gate electrode of the second transistor.

* * * * *